Oct. 10, 1950 J. EPSTEIN 2,524,781

FILTER

Filed June 18, 1945

INVENTOR
J. EPSTEIN
BY Robert Harding Jr.
ATTORNEY

Patented Oct. 10, 1950

2,524,781

UNITED STATES PATENT OFFICE 2,524,781

FILTER

Joseph Epstein, New York, N. Y., assignor to Federal Telephone and Radio Corporation, New York, N. Y., a corporation of Delaware Application June 18, 1945, Serial No. 599,983

4 Claims. (Cl. 178—44)

My invention relates to filters, particularly to filters of the band pass type which will sharply cut off or eliminate a predetermined portion of a frequency band.

Inductances, capacitances and resistances have been employed in various combinations to restrict and define the boundaries of pass bands, quite complicated networks being employed to attenuate unwanted frequencies close to or within the band to be passed. In most such networks it is difficult to completely eliminate the unwanted frequencies without attenuating the frequencies to be passed.

An object of my invention is to provide a simple, inexpensive filter to be used in a band elimination filter.

Another object of my invention is to provide a filter which will sharply define the boundary or boundaries of a pass band.

My novel band elimination filter comprises essentially a parallel circuit connected in series in one arm of a transmission line with a piezoelectric crystal in one arm and a resistance in the other arm of the parallel resonant circuit. The frequencies to be eliminated are reversed in phase as they pass through the crystal which is dimensioned to be resonant for those frequencies to be eliminated and are algebraically added to other currents of the same frequencies and amplitude, but of unaltered phase, to provide zero voltage of those frequencies at the output side of the parallel circuit, other frequencies being passed substantially unattenuated.

Figures 2A, 2B:
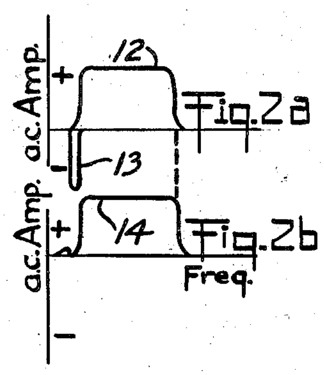
Figure 1:
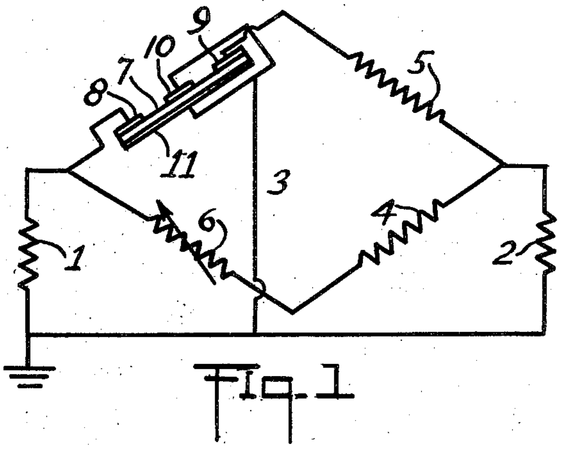
Figure 3:
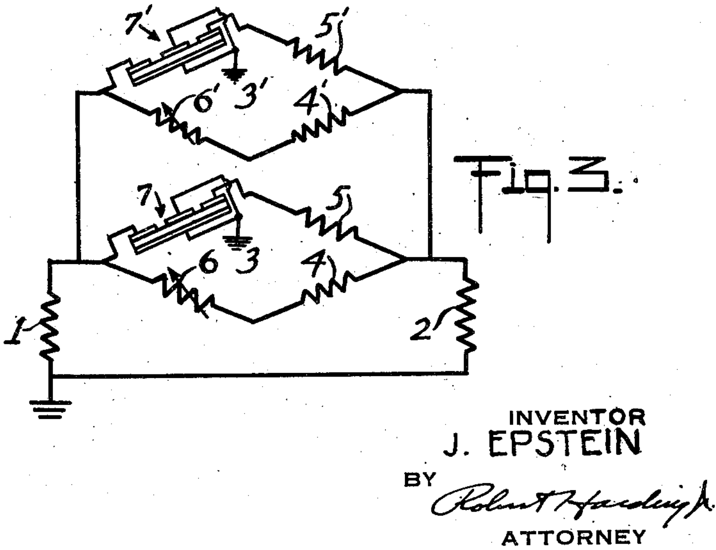

My invention is defined with particularity in the appended claims and preferred embodiments thereof are described in the following specification and shown in the accompanying drawing in which, Fig. 1 is a schematic wiring diagram of an embodiment of my invention, Figs. 2*a* and 2*b* show frequency-attenuation curves of my novel filter, Fig. 3 is a schematic wiring diagram of another embodiment of my invention in which two filters are employed for attenuating the unwanted frequencies at two points of the band to be passed.

In Fig. 1 my novel filter is coupled between the source 1 of frequencies on the one hand and a load 2 on the other. The source and the load as viewed from the filter 3 may, if desired, comprise the incoming and outgoing transmission lines of, for example, a carrier telephone system. The particular filter shown is adapted to sharply attenuate the frequencies in any desired portion of the pass band.

My filter comprises a parallel circuit with two resistances 4 and 6 in one arm and a resistance 5 and a piezoelectric crystal in the other arm, the two arms being balanced, at the resonant frequency of the crystal, so that currents of equal amplitude flow through branches 4—6 and 5—7 of the bridge.

The crystal of my invention is of the type discussed by Lothar Rohde, of Munich, in Zeitschrift Fur Technische Physik, 1939, Number 3, pages 75-80 and shown in Fig. 2. The piezoelectric property of the crystal important to my invention is its ability to reverse the phase of alternating currents flowing between the two electrodes 8 and 9 through the crystal. That is, when the resonant alternating current is a positive maximum at electrode 8, the current is a negative maximum at electrode 9. The crystal appears to be a pure electrical resistance of low value to resonant current, but is practically a nonconductor of off-resonant current.

Arm 6 of the bridge is preferably adjustable so as to exactly balance the resistance and the current in the branch 4—6 with the resonant current in the load circuit.

Then the two equal but out-of-phase currents mutually cancel to produce zero resultant resonant current in the load circuit.

The crystal resonance and the bridge balance may be chosen at any desired frequency with respect to the band of frequencies to be passed. Let it be assumed square corners are desired, at the lower frequencies, on the frequency-attenuation characteristic of a band of carrier telephone signals, and that there is insufficient frequency-space for the usual filter band with sloping sides. The entire band 12 Fig. 2*a* passes through branch 4—6 of my filter, with attenuation proportional to the relatively low values of resistances 4 and 6. If, now, the crystal resonance is chosen at the lowermost frequency to be passed, a narrow band 13 equal in amplitude, but opposite in phase, passes through arms 5 and 7. The algebraic sum of the two out-of-phase currents of like frequency is zero, and the resultant band characteristic, shown at 14 in Fig. 2*b* has a substantially square end.

If desired the crystal of my invention may be of the type discussed by Lothar Rohde, Munich, in Zeitschrift Fur Technische Physik, 1939, and shown in Fig. 3. In the particular type of crystal assembly used in my invention, the desired phase shift is obtained between electrodes 8 and 9 spaced apart on one side of a rectangular flat crystal. The electrodes are elongated and are arranged, in parallel relationship, along opposite edges of the crystal. A sheet-like electrode 11 covers the under side of the crystal and is connected to ground, and the electrodes 8 and 9 are effectively screened by a correctly dimensioned electrode 10 placed between the electrodes 8 and 9 and also grounded so that the only influence electrode 8 may have upon electrode 9 will be through the mechanical vibration of the crystal. If an alternating voltage resonant with the crystal frequency is applied between electrodes 8 and 11, the crystal mechanically vibrates in the direction lengthwise or longitudinally of electrode 8. Since the only interaction between electrodes 8 and 9 is by way of the mechanical vibration of the crystal, these two electrodes are electrically independent, and alternating voltages at electrode 9 are only of the frequency of the crystal, all other frequencies being blocked.

If desired, two filters each of the type shown in Fig. 1 may be used for sharply attenuating the unwanted frequencies at spaced points, say at both ends, of the band to be passed. As shown in Fig. 3 the impedances of second parallel circuit 4′, 5′, 6′, and 7′ are similar to those of the first parallel circuit 4, 5, 6, 7, the resistances of one parallel circuit easily being made substantially independent of the resistances in the other parallel circuit by making them of a different order of magnitude.

The frequencies to be eliminated may be anywhere in the pass band. Good results were obtained in eliminating 100 k. c. from a band extending from 50 k. c. to 200 k. c. The resistances of 4 and 5 were approximately 500 ohms each, while the resistances of 6 and 7 were in the neighborhood of 1700 ohms each. As is well known in the art, the apparent equivalent resistance of a quartz crystal, varies with the applied voltage, and mounting at any given frequency. Therefore the balancing resistance, 6, will vary with the above factors to obtain balance. Any substance exhibiting piezoelectric properties, such as quartz, Rochelle salt, tourmaline, and potassium dehydrogen phosphate, upon being properly cut and oriented may be used as crystal material in my device.

My novel circuit is an effective band elimination filter or attenuating network yet is simple, inexpensive and easy to install, operate and adjust.

I claim:

1. A band elimination filter comprising a piezoelectric crystal, two spaced metal electrodes placed against said crystal at potential points of dissimilar phases, connections from said electrodes respectively to an alternating current source and to a load, and a path for direct current connected in parallel to said crystal, said path being of substantially the same ohmic resistance as the resistance between said electrodes through the crystal at crystal resonance.

2. A filter according to claim 1 in which the two metal electrodes are arranged on one side of the crystal and which further comprises a third electrode between said two electrodes and a fourth electrode on the opposite side of said crystal, said third and fourth electrodes being connected together for shielding the said two metal electrodes from each other.

3. A band elimination filter comprising, a source of frequencies to be filtered, a load, a plurality of piezoelectric crystals, each of said crystals having two spaced metal electrodes placed against said crystal at potential points of dissimilar phases and connections from said electrodes respectively to said source and said load, and a plurality of direct paths between said source and said load, said crystals being resonant to different of said frequencies.

4. In the band elimination filter defined in claim 3, said direct paths being resistive and of ohmic values substantially equal, respectively, to the equivalent resistance at resonance of said crystals.

JOSEPH EPSTEIN.

REFERENCES CITED

The following references are of record in the file of this patent:

UNITED STATES PATENTS

| Number | Name | Date |
|---|---|---|
| 1,759,952 | McCurdy | May 27, 1930 |
| 1,890,543 | Holden | Dec. 13, 1932 |
| 2,075,526 | Koch | Mar. 30, 1937 |
| 2,266,658 | Robinson | Dec. 16, 1941 |
| 2,308,397 | Starr | Jan. 12, 1943 |
| 2,373,431 | Sykes | Apr. 10, 1945 |